United States Patent

Sonoda et al.

[11] Patent Number: 5,911,823
[45] Date of Patent: Jun. 15, 1999

[54] METHOD FOR PULLING A SINGLE-CRYSTAL SEMICONDUCTOR

[75] Inventors: Kouji Sonoda; Toshio Mimura, both of Hiratsuka, Japan

[73] Assignee: Komatsu Electronics Metals Co., Ltd., Hiratsuka, Japan

[21] Appl. No.: 08/762,584

[22] Filed: Dec. 10, 1996

[30] Foreign Application Priority Data

Dec. 13, 1995 [JP] Japan .................................. 7-346827

[51] Int. Cl.$^6$ .................................................. C30B 15/20
[52] U.S. Cl. .............................. 117/30; 117/31; 117/32; 117/917
[58] Field of Search ................... 117/30, 31, 32, 117/917

[56] References Cited

U.S. PATENT DOCUMENTS

| 5,178,720 | 1/1993 | Frederick | 117/20 |
| 5,196,085 | 3/1993 | Szekely et al. | 117/32 |
| 5,349,921 | 9/1994 | Barraclough et al. | 117/32 |

*Primary Examiner*—Felisa C. Garrett-Hiteshew
*Attorney, Agent, or Firm*—Varndell Legal Group

[57] ABSTRACT

A method for pulling a <110> single-crystal silicon aims at preventing the crystal from being cut in diameter-reducing and suppress the increase in cost due to the cut prevention to the minimum. In the step for forming a diameter-reduced portion performed prior to the step for growing a <110> single-crystal silicon by the Czochralski method, a magnetic field having a strength of 500 gauss or more is applied and while suppressing a melt surface vibration and temperature variation, the crystal diameter is reduced to 2.00 mm or smaller.

10 Claims, 2 Drawing Sheets

METHOD FOR PULLING A SINGLE-CRYSTAL SEMICONDUCTOR

FIELD OF THE INVENTION

The present invention relates to a method for pulling a single-crystal semiconductor.

BACKGROUND ART

Semiconductor devices are formed on a substrate of high-purity single-crystal semiconductor, which is fabricated by, for example, pulling a cylindrical single-crystal from the melt in a crucible, as well-known as the Czochralski method hereinafter called the CZ method. In the CZ method, polysilicon material is charged in the crucible inside a single-crystal semiconductor pulling apparatus. The polysilicon material is heated and melted by means of heaters around the crucible. A seed held by a seed holder is immersed in the melt, and then is pulled while rotating the seed holder and the crucible in the same direction or the opposite directions to grow the single-crystal semiconductor.

As compared with single-crystal grown along the <100>, <111> or <511> orientation that has been mass-produced by using the CZ method, with a single-crystal grown along the <110> orientation it is more difficult to remove the dislocation in a so-called diameter-reducing step in which dislocation in a crystal is removed by growing the crystal from the seed. The reason is that, in the single-crystal grown along the <110> orientation, the dislocation is located in the orientation parallel to the axis of the seed crystal, i.e., in the vertical direction in the single-crystal semiconductor pull apparatus, and the same as the growth direction of the single-crystal, the dislocation extends along the <110> orientation. As a solution of this, a so-called multi-step diameter-reducing method has been employed by which a diameter-reduced portion is made to have large or small diameters in a range of 3–6 mm. Referring to FIG. 2 showing a schematic view of the diameter-reduced portion to which the diameter-reducing method has been performed, the diameter of a diameter-reduced portion 2 is gradually made smaller from the point where it is connected to the seed 1 and thereafter the diameter is enlarged to have a larger diameter d1 of 4–6 mm and the is reduced to have a smaller diameter d2 of 3–4 mm. The dislocation is removed by repeating this step three times or more. A shoulder fabrication step is then carried out.

However, the diameter-reducing step carried out in the general hot zone without a magnetic field is affected by the heat convection of the silicon melt, inert gas blowing, crucible rotation, and so on. Therefore, the melt surface is vibrated and when crystal diameter is reduced to be in the range of 2.0–3.5 mm, the crystal at the melt surface is apt to crack. If the diameter is increased to prevent cracking, the dislocation cannot be removed. Therefore, it has been considered that the single-crystal semiconductor grown along the <110> orientation cannot be mass-produced by the pulling method.

Two issues in the fabrication process of the <110> single-crystal are quite important for putting it in mass-production. The premier issue is to prevent the crystal from cracking in the diameter-reducing step, and the second, is to minimize the increase in cost in connection with the cracking prevention.

SUMMARY OF THE INVENTION

Accordingly, the present invention is made while considering the above-described problems in the conventional technology, and an object of the present invention is to provide a method for pulling a <110> single-crystal semiconductor to overcome the aforementioned difficulties.

To achieve the above-mentioned object, the method for pulling a <110> single-crystal silicon of the invention is characterized in that, in the diameter-reducing step which is performed prior to a step of growing a <110> single-crystal silicon by the CZ method, a magnetic field having a strength of more than 500 gauss is applied and, while suppressing a melt surface vibration and temperature variation, a diameter of the crystal is reduced to be 2.0 mm or less.

The magnetic field strength is gradually reduced in a shoulder formation step succeeding the diameter-reducing step, and is completely eliminated to zero before a step of forming a cylindrical body.

The present invention relates therefore to a diameter reducing step which is processed by a pulling-under-magnetic-field method (hereinafter called MCZ method) in which the whole hot zone is applied with a magnetic field for suppressing the melt surface vibration due to the melt convection as well as the temperature variation of melt surface. When the magnetic field is applied in the whole hot zone by using the MCZ method, the conductive melt which intersects with the magnetic flux at right angle will have a higher effective mobile viscosity, and the melt convection is suppressed to reduce the temperature variation of the melt surface. Therefore, as compared with the conventional method in which no magnetic field is applied, the temperature variation of the melt can be vastly reduced by applying a magnetic field of 500 gauss or more.

For instance, as compared with a temperature variation of about 1.5° C. in the melt surface without magnetic field, the suppression of melt convection by applying a magnetic field of 1500 gauss can reduce the temperature variation to about 0.1° C. As a result, a thin crystal diameter of smaller than 1.5–2.0 mm can be attained under the 1500 gauss-magnetic field, which thin diameter cannot be realized in the conventional CZ method, thereby facilitating the mass-production of the <110> single-crystal silicon without dislocation.

As stated above, the diameter-reducing step can be preferably carried out. However, the manufacturing cost increases as the magnetic field is applied. Therefore, techniques for gradually reducing the magnetic field in the steps succeeding the diameter-reducing step are required for mass-production. When the magnetic field applied to the whole hot zone is gradually weakened, the melt convection and the melt surface temperature increases so that the diameter of the crystal tends to be thinner. Therefore, to completely eliminate the magnetic field to zero gauss by the end of the shoulder formation step before the straight body growth step for growing the single-crystal while maintaining the crystal diameter is much better than reducing the magnetic field strength when the straight body growth step begins.

The applied magnetic field may be a horizontal magnetic field whose direction is perpendicular to the single-crystal pulling axis. Alternatively, the applied magnetic field may be a magnetic field whose magnetic flux is symmetric to and radial from the single-crystal pulling axis.

Further, the magnetic field may be reduced at a constant rate which depends on the magnetic field strength and the time required for the shoulder formation step.

Moreover, the increase in the melt temperature due to the reduction of the magnetic field strength can be compensated by reducing the temperature of the heaters.

BEST MODE FOR CARRYING OUT THE INVENTION

Figure 1:
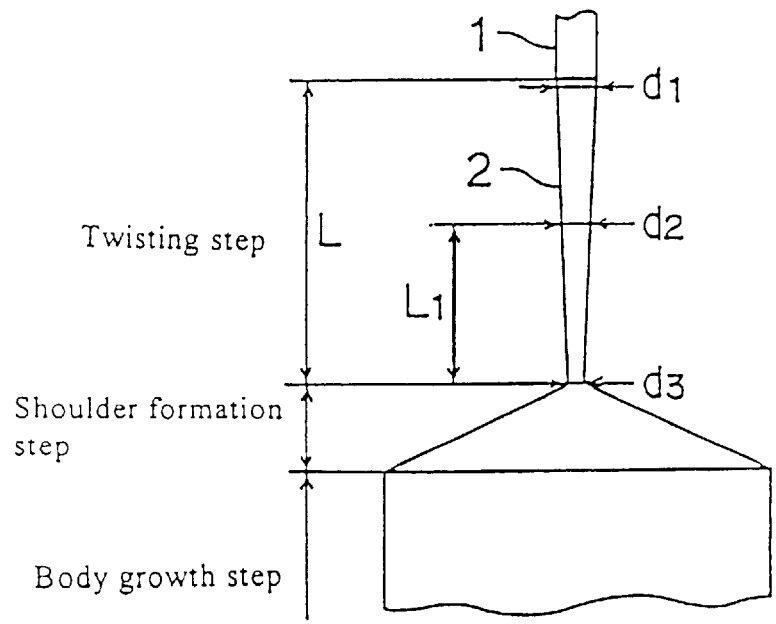
FIG. 1 is a schematic diagram illustrating the upper portion of a <110> single-crystal semiconductor fabricated by the pulling method of the invention.

The embodiment of the present invention will be described in accompaniment with the drawings. FIG. 1 illustrates the upper portion of the <110> single-crystal silicon fabricated by the pulling method of the invention.

Figure 2:
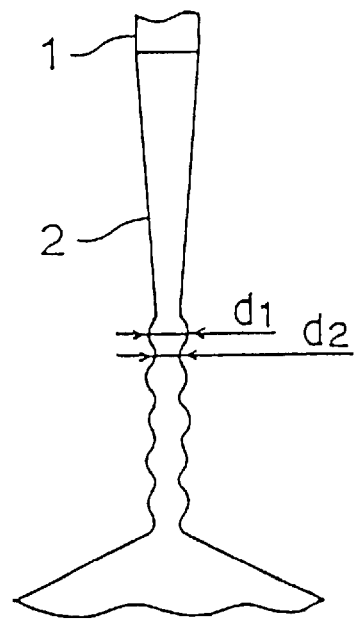
FIG. 2 illustrates the shape of the diameter-reduced portion of a single-crystal semiconductor fabricated by the multi-step diameter-reducing method.

In the single-crystal semiconductor pulling apparatus, a chamber was retained in a vacuum state of 14–20 Torr and an inert gas, such as argon gas, was introduced thereinto at a flow rate of $3-5 \times 10^{-2}$ Nm$^3$/min. The whole hot zone was applied with a horizontal magnetic field of 1500–4000 gauss, which is perpendicular to the pulling axis of the single-crystal. FIG. 2 illustrates the seed 1 was immersed in the melt, and then a seed holder (not shown in the figure) was gradually pulled up to start the diameter-reducing step. The diameter-reducing step begins to form a crystal diameter d1 of 8 mm, and then the crystal is tapered to become thinner so that the diameter d2 is 2 mm and in the end of the portion the crystal diameter (smallest diameter) d3 is smaller than 1.5–2.0 mm. The length L of the diameter-reduced portion 2 is 50–300 mm. The portion in which the diameter is smaller than 2.0 mm (i.e., the region between the crystal diameter d2 and d3) has a length L1 of 10–100 mm. The portion in which the diameter is smaller than 2.0 mm is pulled at a rate of 5.0–6.0 mm/min.

When the straight body portion of the single-crystal, in which the diameter is about 103 mm, is pulled, a shoulder formation step succeeding the diameter-reducing step should take 30–100 minutes, and the magnetic field strength is gradually reduced in inverse proportion to the required time. For example, if the magnetic field strength is 1500 gauss and the time required in the shoulder formation step is 100 minutes, the declining rate in the magnetic field strength can be 15 gauss/minute. Moreover, if the magnetic field strength is 4000 gauss and the shoulder formation takes 30 minutes, the declining rate can be 140 gauss/minute. Therefore, it was so controlled that when the shoulder formation step is terminated and the crystal diameter reaches 103 mm, the magnetic field is reduced to zero. That is, the magnetic field is weakened gradually in the formation of the shoulder portion, thus eliminating the magnetic field before the start of the straight body growth step. Alternatively, the magnetic field may be reduced in the shoulder formation step at a constant rate which depends on the magnetic field strength and the time required for the shoulder formation step.

In the aforementioned process, the single-crystal did not crack in the diameter-reducing step and stable diameter reducing could be performed. Moreover, no dislocation was found in the grown <110> single-crystal silicon. This is because in the diameter-reducing step, the diameter-reduced portion 2 was formed to have a more than 10 mm-long region in which the diameter is smaller than 2.0 mm so that dislocation was removed.

Since the dislocation orientation is identical to the growth direction so that it is difficult to eliminate dislocation during the diameter-reducing step in the <110> single-crystal silicon, and therefore the <110> single-crystal silicon is considered as being not suited for mass-production, unlike the <100>, <111> and <511> single-crystal silicon products which are put in mass-production, there is still no technical standard for mass-producing the <110> single-crystal silicon. Moreover, in the conventional method, since the growing <110> single-crystal tends to crack near the solid-liquid interface, 90 out of 100 are defective, only 10 being able to be successfully pulled (i.e., the yield is 10%).

Applying a magnetic field of 1500 gauss in the diameter-reducing step, however, can reduce a crystal diameter to be smaller than 1.5–2.0 mm, which the conventional CZ method is difficult to achieve. As a result, pulling of <110> single-crystal silicon becomes easy, and practically 100 out of 100 were satisfactory (i.e., the yield is 100%).

The invention reduces gradually the magnetic field strength in the shoulder formation step and completely eliminates the magnetic field before the straight body growth step, thereby overcoming the raising of the manufacturing cost to minimum. Therefore, as compared with the conventional MCZ method, the present invention reduces one half of the electricity cost and is economically benefitted.

Figure 3:
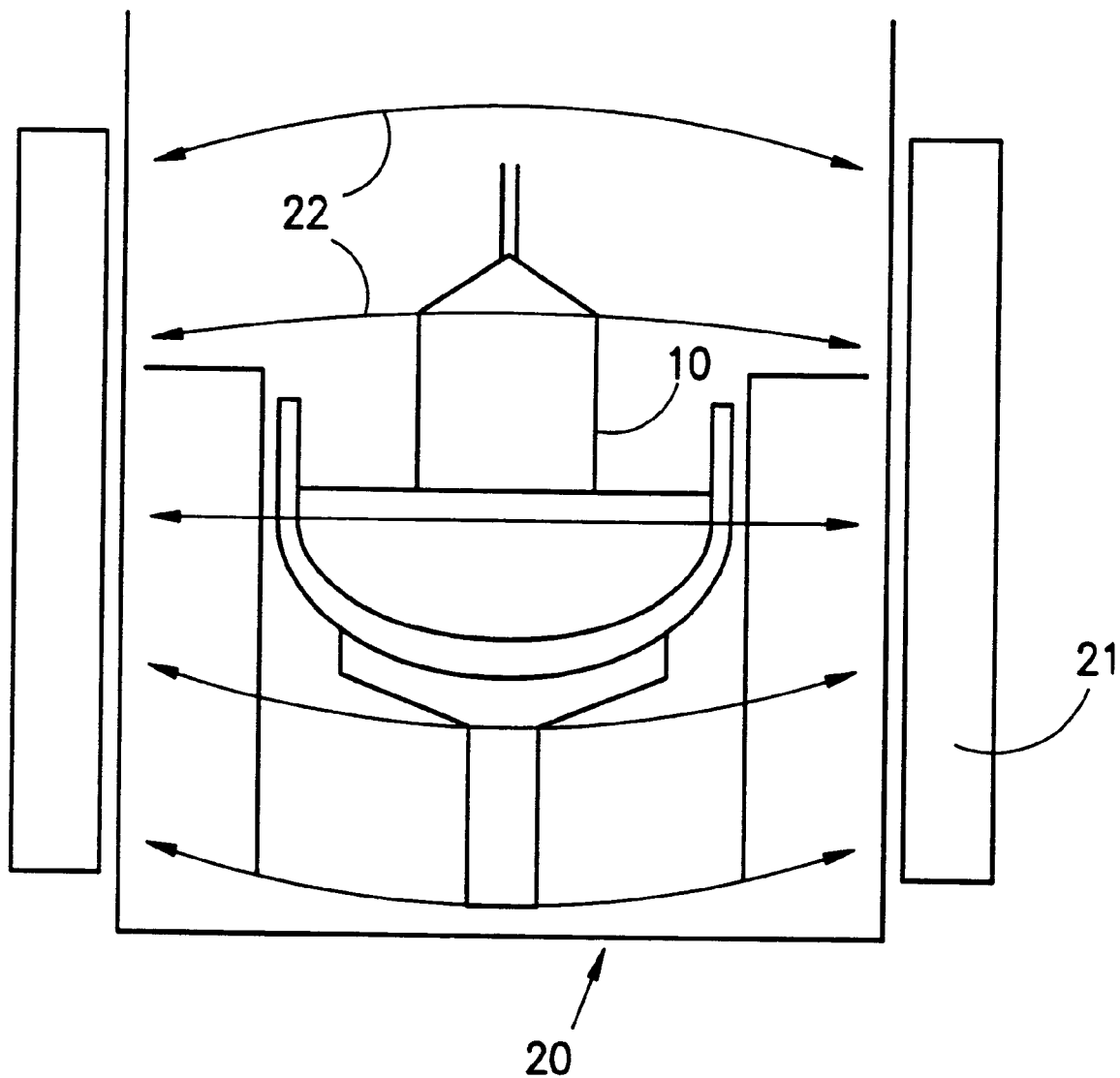
FIG. 3 illustrates the application of the horizontal magnetic field during the pulling method of the present invention.

FIG. 3 shows the application of the horizontal magnetic field to the single-crystal silicon wafer according to the present invention. As shown in FIG. 3, an apparatus 20 is provided for pulling the single-crystal silicon wafer 10 within a horizontal magnetic field applying means 21. The double-arrowhead lines 22 show the magnetic field relative to the single-crystal silicon wafer 10.

The present invention therefore provides the possibility of mass-producing the <110> single-crystal silicon wafer in which devices can be integrated at a high density.

In the present invention, a magnetic field strength of larger than 500 gauss is applicable to reduce crystal diameter, although a strength of 1500–4000 gauss was disclosed in the aforementioned embodiment.

Further, in order to reduce the crystal diameter to 2.0 mm or less, the magnetic field strength may be set to 1,500 gauss or more.

Moreover, although the magnetic field is applied in the direction perpendicular to the pulling axis in the above-described embodiment, the magnetic field should not be limited to the embodiment, for example, it can be a cusp magnetic field.

Furthermore, although the magnetic field strength is disclosed to reduce at a constant rate which depends on the magnetic field strength and the time required for the shoulder formation in the shoulder formation step, the magnetic field may be reduced not at a constant rate as far as it may be reduced gradually to zero gauss before the straight body growth step starts.

What is claimed is:

1. A method for pulling a <110> single-crystal silicon by means of a Czochralski method comprising the steps of:

a diameter-reducing step for reducing a crystal diameter to smaller than 2.0 mm by applying a magnetic field having a strength of 500 gauss or more while suppressing a melt surface vibration and temperature variation;

a shoulder formation step for forming a shoulder portion by increasing the crystal diameter; and a straight-body growth step for forming a cylindrical rod body.

2. The method as claimed in claim 1, wherein the magnetic field applied in the diameter-reducing step has a strength of 1500 gauss.

3. The method as claimed in claim 1, wherein the magnetic field applied in the diameter-reducing step has a strength of 1500–4000 gauss.

4. The method as claimed in claim 3, wherein the region having a diameter of smaller than 2.0 mm formed in the diameter-reduced portion has a length of 10 mm or more.

5. The method as claimed in any of claims 1 through 4, wherein the magnetic field applied in the diameter-reducing step is reduced and reaches zero before the body growth step starts.

6. The method as claimed in any of claims 1 through 5, wherein the magnetic field applied in the diameter-reducing step is a horizontal magnetic field whose direction is perpendicular to a single-crystal pulling axis.

7. The method as claimed in any of claims 1 through 5, wherein the magnetic field applied in the diameter-reducing step is a cusp magnetic field.

8. The method as claimed in claim 6, wherein the magnetic field is reduced in the shoulder formation step at a constant rate which depends on the magnetic field strength and time required for the shoulder formation step.

9. The method as claimed in claim 6, wherein the magnetic field applied in the diameter-reducing step is gradually reduced in the shoulder formation step so as to reach zero before the body growth step starts.

10. The method as claimed in claim 4, wherein the diameter-reduced portion has a diameter of about 8 mm at a time when the diameter-reducing step begins, and then is tapered to have a diameter of 2 mm and a minimum diameter of 1.5–2.0 mm at a time when the diameter-reducing step ends; where a total length of the diameter-reduced portion is 50–300 mm in which a region where the diameter is smaller than 2.0 mm has a length of 10–100 mm; and the pulling rate for the region where the diameter is smaller than 2.0 mm is 5.0–6.0 mm/min.

* * * * *